(12) United States Patent
Jocham et al.

(10) Patent No.: US 11,343,925 B2
(45) Date of Patent: May 24, 2022

(54) HOUSING FRAME FOR A CONTROL UNIT, WHICH HOUSING FRAME IS SUITABLE FOR EXTERNALLY ELECTRICALLY CONTACTING A CIRCUIT CARRIER OF THE CONTROL UNIT

(71) Applicant: Robert Bosch GmbH, Stuttgart (DE)

(72) Inventors: Reinhold Jocham, Reutlingen (DE); Ulrich Trescher, Tuebingen (DE); Sascha Bader, Schorndorf (DE); Oliver Schilli, Lichtenstein (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/269,472

(22) PCT Filed: Jul. 22, 2019

(86) PCT No.: PCT/EP2019/069691
§ 371 (c)(1),
(2) Date: Feb. 18, 2021

(87) PCT Pub. No.: WO2020/038678
PCT Pub. Date: Feb. 27, 2020

(65) Prior Publication Data
US 2021/0329797 A1   Oct. 21, 2021

(30) Foreign Application Priority Data
Aug. 21, 2018   (DE) .................. 10 2018 214 059.6

(51) Int. Cl.
*H05K 5/00*   (2006.01)
(52) U.S. Cl.
CPC ................. *H05K 5/0069* (2013.01)

(58) Field of Classification Search
CPC .................................................. H05K 5/0069
See application file for complete search history.

(56) References Cited

U.S. PATENT DOCUMENTS

| 7,449,726 | B2 * | 11/2008 | Nakanishi | ............. | H01L 25/165 |
| | | | | | 257/177 |
| 2006/0068609 | A1 * | 3/2006 | Yokozuka | ............. | H05K 5/069 |
| | | | | | 439/55 |

(Continued)

FOREIGN PATENT DOCUMENTS

| CN | 101417602 A | 4/2009 |
| CN | 101790802 A | 7/2010 |

(Continued)

OTHER PUBLICATIONS

International Search Report corresponding to PCT Application No. PCT/EP2019/069691, dated Oct. 25, 2019 (German and English language document) (5 pages).

*Primary Examiner* — Rockshana D Chowdhury
(74) *Attorney, Agent, or Firm* — Maginot, Moore & Beck LLP

(57) ABSTRACT

A housing frame for a control unit for controlling an electrical machine is disclosed. The housing frame has at least one connection pin for electrically contacting a circuit carrier of the control unit. The connection pin has a connection base and is injected into the housing frame such that the connection pin can be electrically connected to the circuit carrier at the connection base by way of laser beam welding. Also disclosed is a control unit having a housing frame, an electrical machine having a control unit, and to a method for electrically connecting a connection pin of the housing frame to a circuit carrier of a control unit.

13 Claims, 8 Drawing Sheets

(56) References Cited

U.S. PATENT DOCUMENTS

| | | | |
|---|---|---|---|
| 2008/0150102 A1* | 6/2008 | Yokomae | H01L 25/50 |
| | | | 257/675 |
| 2011/0005813 A1 | 1/2011 | Boyd | |
| 2014/0138075 A1* | 5/2014 | Yang | H01L 23/473 |
| | | | 165/185 |
| 2017/0064808 A1 | 3/2017 | Rizza et al. | |
| 2017/0164509 A1 | 6/2017 | Flamm et al. | |
| 2018/0177058 A1* | 6/2018 | Liskow | H05K 3/284 |

FOREIGN PATENT DOCUMENTS

| | | |
|---|---|---|
| CN | 102347295 A | 2/2012 |
| CN | 102437444 A | 5/2012 |
| CN | 102668729 A | 9/2012 |
| DE | 33 08 328 A1 | 9/1984 |
| DE | 10 2007 041 136 A1 | 3/2009 |
| DE | 10 2007 061 116 A1 | 6/2009 |
| DE | 10 2011 085 629 A1 | 5/2013 |

\* cited by examiner

HOUSING FRAME FOR A CONTROL UNIT, WHICH HOUSING FRAME IS SUITABLE FOR EXTERNALLY ELECTRICALLY CONTACTING A CIRCUIT CARRIER OF THE CONTROL UNIT

This application is a 35 U.S.C. § 371 National Stage Application of PCT/EP2019/069691, filed on Jul. 22, 2019, which claims the benefit of priority to Serial No. DE 10 2018 214 059.6, filed on Aug. 21, 2018 in Germany, the disclosures of which are incorporated herein by reference in their entirety.

BACKGROUND

The disclosure is based on a housing frame for a control unit for driving an electrical machine, wherein the housing frame has at least one connection pin for electrically contacting a circuit carrier of the control unit.

To date, circuit carriers have typically been contacted by means of ultrasonic bonding of thick aluminum wires or aluminum strips onto the circuit carrier, which thick aluminum wires or aluminum strips are then guided to the outside for example in order to electrically connect the circuit carrier to further external components.

SUMMARY

The disclosure is based on a housing frame for a control unit for driving an electrical machine, wherein the housing frame has at least one connection pin for electrically contacting a circuit carrier of the control unit.

A housing frame is to be understood to mean an element which forms at least one part of a control unit for driving an electrical machine. Here, the housing frame is formed substantially from plastic. Here, substantially formed from plastic is in turn to be understood to mean that the housing frame contains mainly plastic and has only a small content, for example in the single-digit percentage range, of one or more substances that are different from plastic. These substances that are different from plastic can be, for example, impurities. However, the substances that are different from plastic can also be deliberately admixed in order to influence properties, such as the flexibility or durability for example. However, it is also conceivable for the housing frame to additionally contain a glass fiber filling which can particularly preferably form up to 30% of the housing frame.

A connection pin is to be understood to mean a structural element which can conduct electric current and serves to electrically connect various other structural elements to one another. In this case, this may be, for example, a connection between an electronic structural element of the control unit and an electrical energy source which is arranged, for example, outside the control unit.

One aspect of the disclosure is that the connection pin has a connection foot and is injection-molded into the housing frame in such a way that the connection pin can be electrically connected to the circuit carrier at the connection foot by means of laser welding.

It is advantageous here that less space on the circuit carrier is required at the corresponding electrical connecting point in the case of a laser welding connection than in the case of a bonding connection. As a result, the circuit carrier can, given the same function, either be selected to be smaller or else more components than before can be installed on the circuit carrier.

In a refinement of the housing frame according to the disclosure, provision is made for the connection pin to have a resilient section.

It is advantageous here that, owing to the resilient action, a force which presses the connection foot onto the circuit carrier can act on the connection foot as soon as the housing frame is accordingly installed in a control unit. Owing to this force, the laser welding connection can then be implemented in a simple manner, without further mechanical fixing of the connection pin on the circuit carrier being required. A further advantage is that, in the case of a control unit which has a corresponding housing frame, thermomechanical stresses can be compensated for by the resilient action of the connection pin during operation of the control unit. As a result, the durability of the electrical connection of a connection pin of this kind and therefore also the durability and reliability of the control unit are extended.

According to a refinement of the housing frame according to the disclosure, provision is made for the resilient section of the connection pin to be configured in an L-shape or S-shape.

It is advantageous here that this represents simple ways of achieving a resilient action of the connection pin.

According to one refinement of the housing frame according to the disclosure, provision is made for the cross-sectional area of the connection pin in the resilient section to be configured to be smaller than outside the resilient section at least in regions.

It is advantageous here that a particularly good spring action can be achieved. This is suitable, in particular, for a connection pin which has to conduct only small currents.

According to a refinement of the housing frame according to the disclosure, provision is made for the connection foot to be configured with a predetermined angle in relation to a main plane of extent of the housing frame.

It is advantageous here that, in the uninstalled state of the housing frame, a corresponding angle is present but, as soon as the housing frame is accordingly installed in a control unit, the connection foot can rest on a connection carrier in a plane-parallel manner on account of the resilient action and additionally a corresponding force acts on the connection foot, which force mechanically fixes said connection foot in order to be able to then laser-weld it in a simple manner.

Here, main plane of extent of the housing frame is to be understood to mean the top side of the housing frame. If the housing frame is installed in a control unit, this top side lies parallel to the main plane of extent of the circuit carrier and to the main plane of extent of the heat sink.

The disclosure additionally relates to a control unit for driving an electrical machine, wherein the control unit has a circuit carrier and a housing frame according to the disclosure, wherein the connection foot of the connection pin is electrically connected to the circuit carrier by means of laser welding.

The control unit according to the disclosure serves to accordingly drive and operate the electrical machine.

The circuit carrier and the housing frame are typically arranged on a heat sink. A heat sink is to be understood to mean an element which can give off heat that is generated by the control unit to the surrounding area. Here, the heat is typically generated by the electronic structural elements that are arranged on the circuit carrier of the control unit. In order to give off the heat, the heat sink can, for example, additionally have cooling fins on its bottom side.

According to a refinement of the control unit according to the disclosure, provision is made for the circuit carrier to be configured as a DBC substrate.

It is advantageous here that, owing to the laser welding in contrast to the ultrasonic bonding, no additional surface coatings of the DBC substrate or of the connection pin are necessary, in particular it the connection pin is likewise formed substantially from copper. As a result, production of the control unit is simplified and in addition costs are reduced.

In construction and connection technology, a DBC substrate is to be understood to mean a structure which allows close electrical/thermal connection between electronic components and chips by means of copper.

The disclosure additionally relates to an electrical machine, in particular an electric motor, comprising a control unit according to the disclosure.

Here, an electric motor is to be understood to mean, for example, a three-phase machine, such as a synchronous machine or an asynchronous machine for example.

Furthermore, the disclosure relates to a method for electrically connecting a connection pin of a housing frame according to the disclosure to a circuit carrier of a control unit.

DETAILED DESCRIPTION

Figure 1:
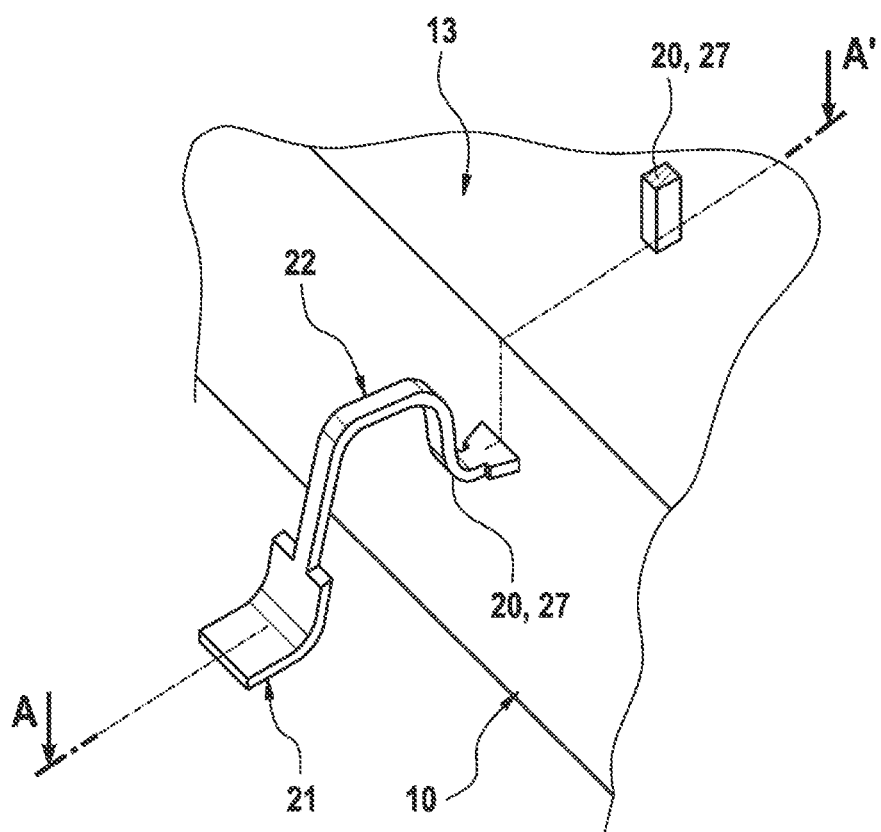
FIG. 1 shows a perspective view of a detail of a first exemplary embodiment of a housing frame according to the disclosure.

FIG. 1 shows a perspective view of a detail of a first exemplary embodiment of a housing frame according to the disclosure. A housing frame 10 is illustrated. A connection pin 20 is injection-molded into the housing frame 10. This connection pin 20 is configured as a signal pin 27. A signal pin 27 is to be understood to mean an element via which electrical signals can be conducted. These electrical signals are present in the form of currents, wherein the currents or voltages at the signal pin 27 are typically small. Therefore, the current intensity of the signal pin 27 is lower than 1 A, typically even has a value of only a few mA. In contrast, the current intensity of the power pin can be 25 to approximately 100 A, wherein 80 to 110 A are typically applied in a clocked manner for short periods.

The connection pin 20 has a resilient section 22 which is configured in an S-shape. Furthermore, the connection pin 20 has a connection foot 21 at which the connection pin 20 can be electrically connected to a circuit carrier 30, not illustrated, by means of laser welding. In addition, it can be seen here that the cross-sectional area of the connection pin 20 in the resilient section 22 is smaller than outside the resilient section 22 at least in regions, in particular smaller than at the connection foot 21 of the connection pin 20.

Figure 2:
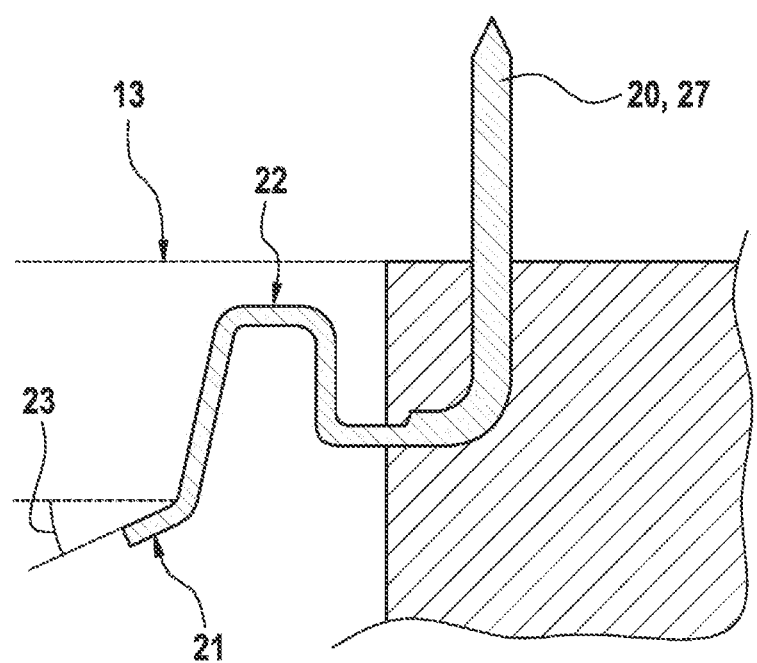
FIG. 2 shows a section through the housing frame according to the disclosure in accordance with FIG. 1.

FIG. 2 shows a section through the housing frame according to the disclosure in accordance with FIG. 1.

Here, the section runs vertically along the line of intersection A-A' shown in FIG. 1.

This figure once again illustrates the housing frame 10 with the connection pin 20 which is configured as signal pin 27. Here, it can be seen that the connection foot 21 of the connection pin 20 spans a predetermined angle 23 with the main plane of extent 13 of the housing frame 10. Wherein this angle 23 is given when the connection pin 20 of the housing frame 10 is not connected to a circuit carrier 30 and therefore the connection pin 20 does not yet have a spring force.

Figure 3:
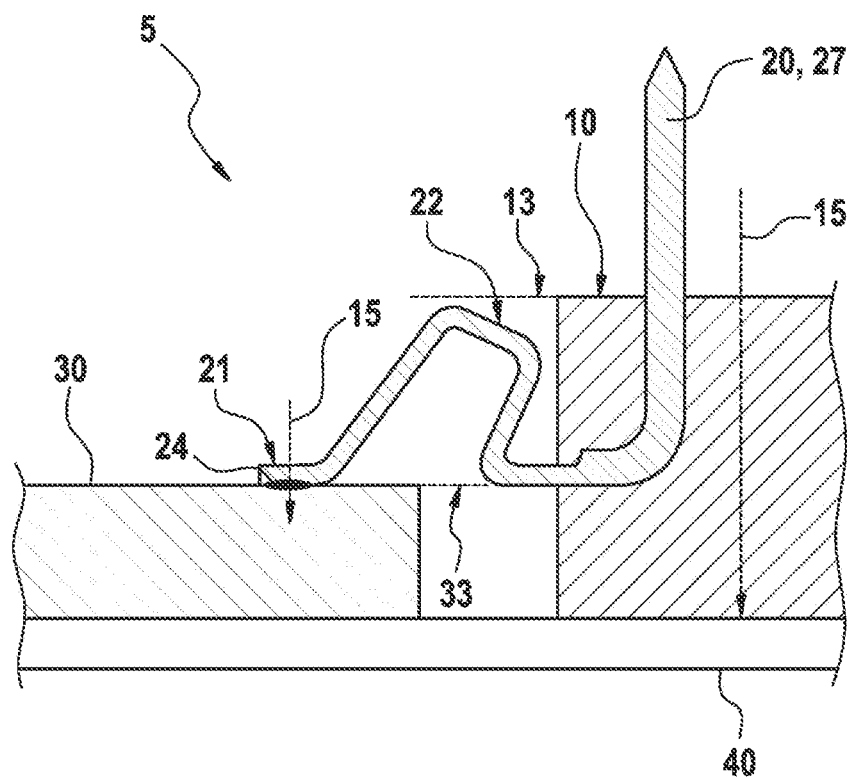
FIG. 3 shows a section through a control unit according to the disclosure which has a housing frame according to the disclosure in accordance with FIG. 1 and FIG. 2.

FIG. 3 shows a section through a control unit according to the disclosure which has a housing frame according to the disclosure in accordance with FIG. 1 and FIG. 2. A control unit 5 which has a heat sink 40, a circuit carrier 30 and a housing frame 10 in accordance with FIG. 1 and FIG. 2 is illustrated. Here, the housing frame 10 is pressed onto the heat sink 40 in such a way that the connection foot 21 of the resilient connection pin 20 rests on the circuit carrier 30 in a manner plane-parallel in relation to the main plane of extent 33 of this circuit carrier 30. Here, the housing frame 10 has been pressed onto the heat sink in the perpendicular direction 15 in relation to the main plane of extent 13 of the housing frame 10. Here, the housing frame 10 can optionally accordingly be fixed on the heat sink 40 by means of a rivet connection, not illustrated. Here, the housing frame 10 and its connection pin 20 are configured in such a way that the connection foot 21 of the connection pin 20 rests on the circuit carrier 30 in a plane-parallel manner and a force 16 is generated in the perpendicular direction 15 in relation to the main plane of extent 13 of the housing frame 10 by the resilient section 22, which force presses the connection foot 21 onto the circuit carrier. Furthermore, the connection foot 21 is electrically connected to the circuit carrier 30 by means of a laser welding connection 24. As a result, it is possible for, for example, another electronic component or an energy source, not illustrated in the figure, to be able to be electrically connected to the circuit carrier 30 by way of that end of the connection pin 20 which is situated opposite the connection foot 21 being accordingly guided to the outside and being contactable.

In addition, it can be seen from comparison of FIG. 2 and FIG. 3 that the connection foot 21, in the case in which the housing frame 10 is not installed in accordance with FIG. 2, is at a corresponding vertical distance from the plane of the housing frame 10 that, when the housing frame 10 is installed in accordance with FIG. 3, rests on the heat sink, this vertical distance being smaller than the vertical distance between the plane of the housing frame 10 that, when the housing frame 10 is in in accordance with FIG. 3, rests on the heat sink and the to side of the circuit carrier 30. Owing to the configuration of the connection pin 20 and the housing frame 10 in such a way that there is a difference in the nominal vertical distance between an uninstalled and installed housing frame 10, there is a spring action of the connection pin 20 in the resilient section 22 when the housing frame 10 is accordingly installed in a control unit 5.

Figure 4:
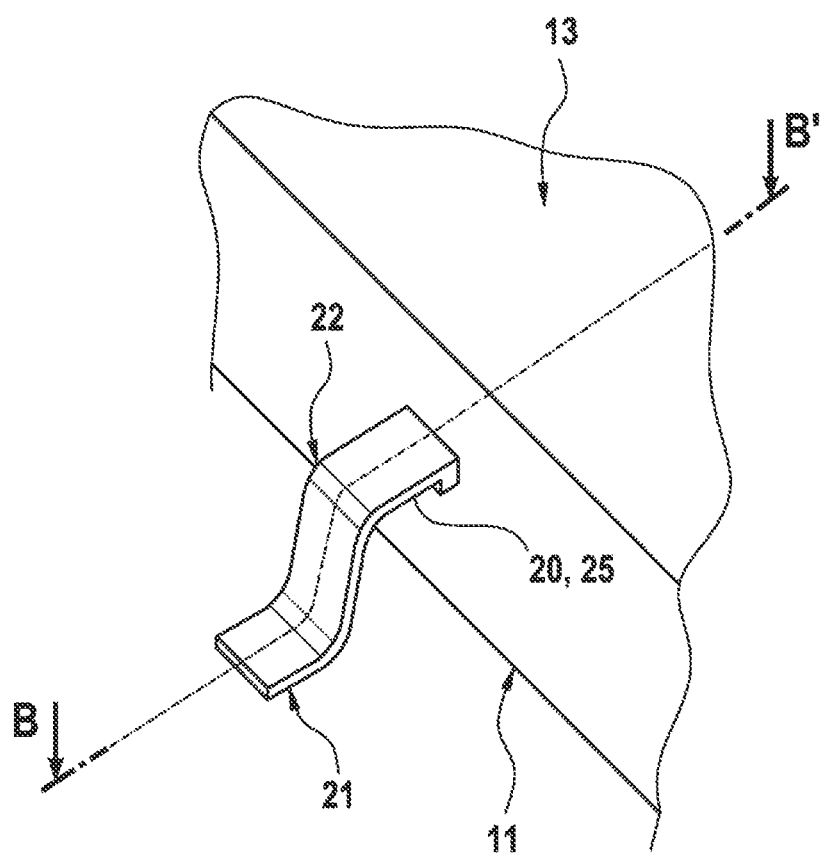
FIG. 4 shows a perspective view of a detail of a second exemplary embodiment of a housing frame according to the disclosure.

FIG. 4 shows a perspective view of a detail of a second exemplary embodiment of a housing frame according to the disclosure. A housing frame 11 is illustrated. A connection pin 20 is once again injection-molded into the housing frame 11. This connection pin 20 is configured as a power pin 25. A power pin 25 is to be understood to mean a connection pin 20 via which currents with considerably higher current intensities than the signal pin 27 can flow. The connection pin 20 once again has a resilient section 22 which, however, in contrast to the signal pin 27, is configured in an L-shape. Furthermore, the connection pin 20 has a connection foot 21 at which the connection pin 20 can be electrically connected to a circuit carrier 30, not illustrated, by means of laser welding.

Figure 5:
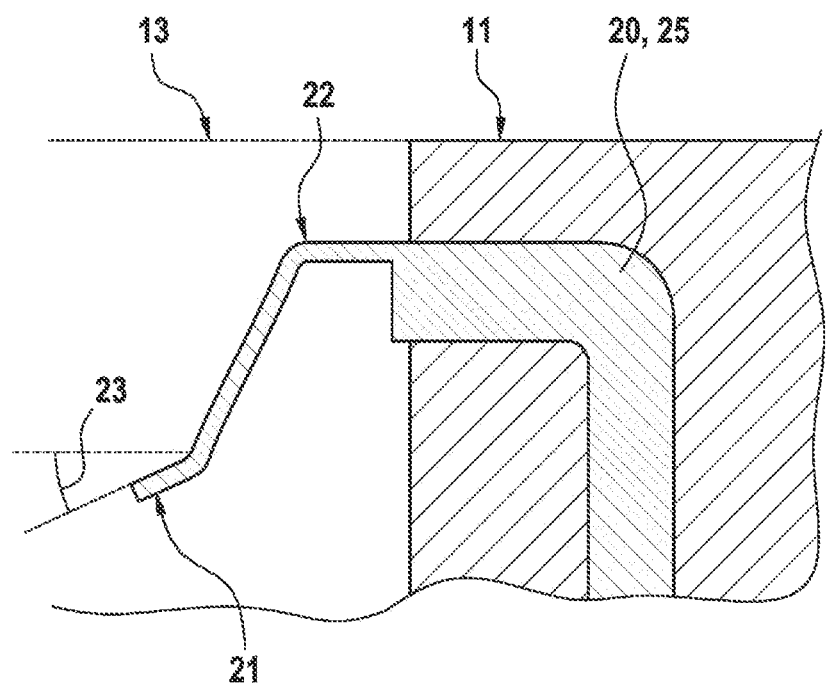
FIG. 5 shows a section through the housing frame according to the disclosure in accordance with FIG. 4.

FIG. 5 shows a section through the housing frame according to the disclosure in accordance with FIG. 4.

Here, the section runs vertically along the line of intersection B-B' shown in FIG. 4.

The housing frame 11 with the connection pin 20, which is configured as a power pin 25, is illustrated once again. It can be seen here that the connection foot 21 of the connection pin 20 once again spans a predetermined angle 23 with the main plane of extent 13 of the housing frame 11. Wherein this angle 23 is given when the connection pin 20 of the housing frame 11 is not connected to a circuit carrier 30.

Figure 6:
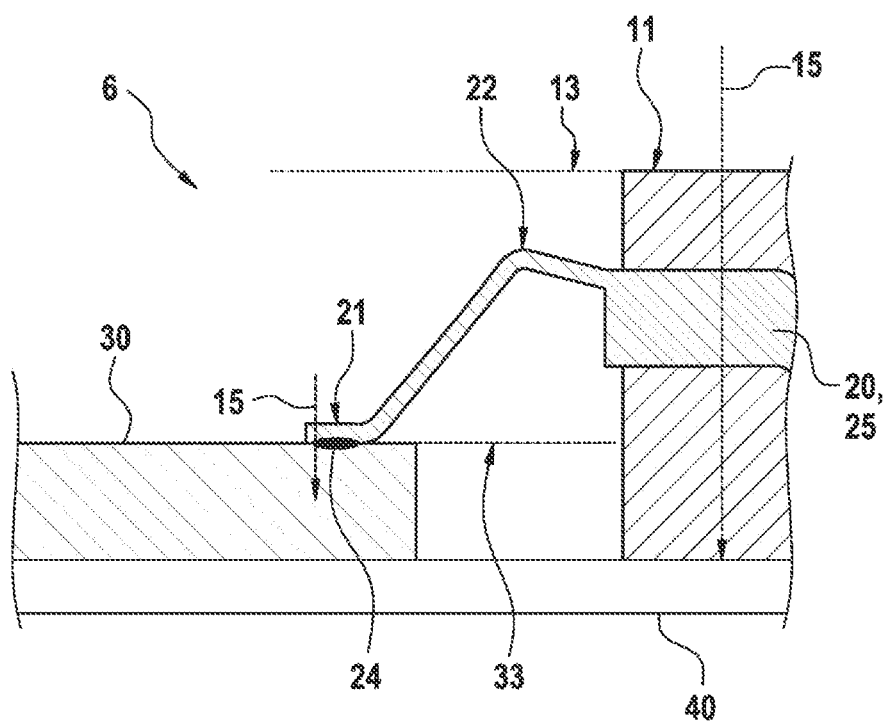
FIG. 6 shows a section through a control unit according to the disclosure which has a housing frame according to the disclosure in accordance with FIG. 4 and FIG. 5.

FIG. 6 shows a section through a control unit according to the disclosure which has a housing frame according to the disclosure in accordance with FIG. 4 and FIG. 5. A control unit 6 which has a heat sink 40, a circuit carrier 30 and a housing frame 11 in accordance with FIG. 4 and FIG. 5 is illustrated. Here, the construction of the control unit 6 in accordance with FIG. 6 corresponds substantially to that of the control unit 5 in accordance with FIG. 3 and differs only by the slightly differently configured connection pin 20 which, in the control unit 6 in accordance with FIG. 6, is configured as a power pin 25 and not as a signal pin 27 as in the control unit 5 in accordance with FIG. 3.

Figure 7:
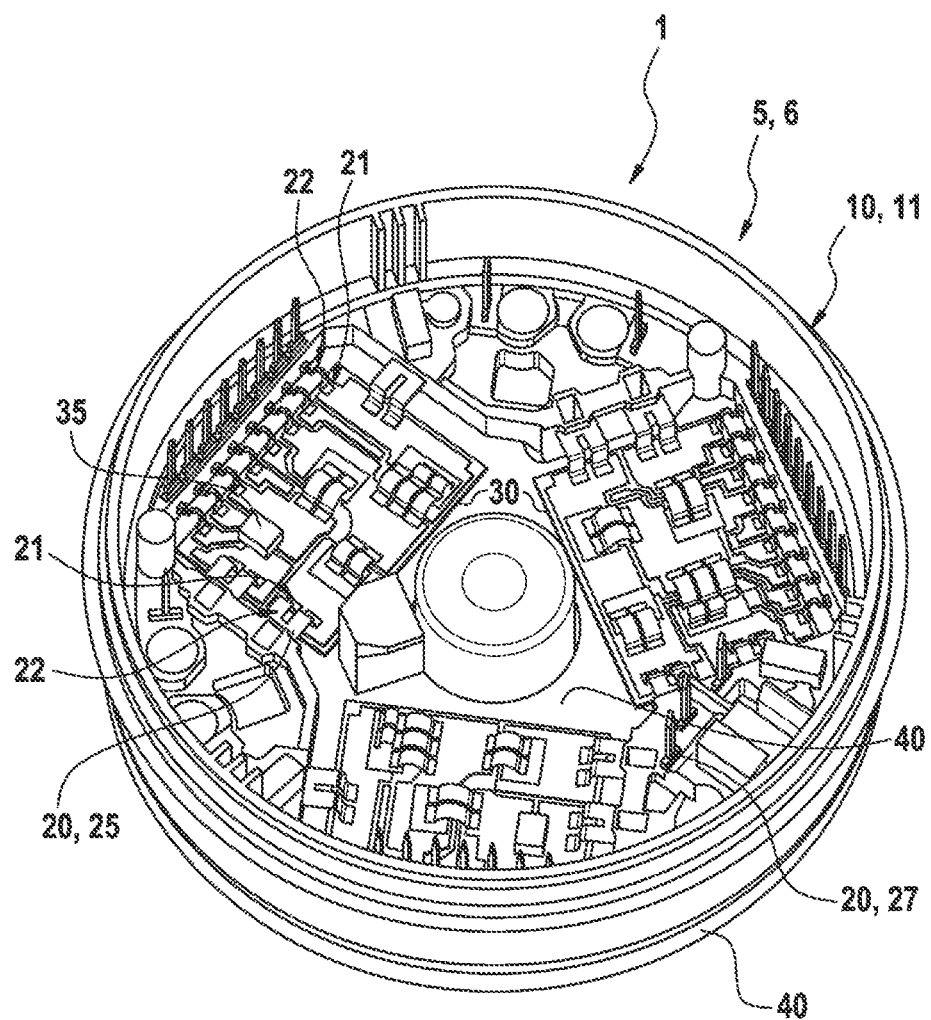
FIG. 7 shows a perspective view of an exemplary embodiment of a schematically illustrated electrical machine according to the disclosure comprising a control unit according to the disclosure.

FIG. 7 shows a perspective view of an exemplary embodiment of a schematically illustrated electrical machine according to the disclosure comprising a control unit according to the disclosure.

An electrical machine 1 is illustrated. This electrical machine 1 can be configured, for example, as an electric motor and, in particular, as a synchronous machine or as an asynchronous machine and therefore form a three-phase machine. The electrical machine 1 has a control unit 5, 6. The control unit 5, 6 in turn has a heat sink 40 and a plurality of circuit carriers 30. Here, the circuit carriers 30 are configured as DBC substrates. In addition, the control unit 5 has a housing frame 10, 11. Here, the housing frame 10, 11 has a large number of connection pins 20, some of which are configured as signal pins 27 in accordance with FIGS. 1 to 3 for example or as power pins 25 in accordance with FIGS. 4 to 6 and accordingly are electrically connected to the circuit carriers 30 by means of laser welding. The circuit carriers 30 are in turn fitted, by way of example, with electronic structural elements 35 which are configured as bare-die structural elements for example. These electronic structural elements 35 can be, for example, capacitors, semiconductor switches, coils, sensors or energy stores in order to allow a corresponding electronic circuit for driving and operating the electrical machine 5. As a result, the electronic structural elements 35 can be electrically contacted from outside the control unit 5, 6 via the connection pins 20.

Figure 8:
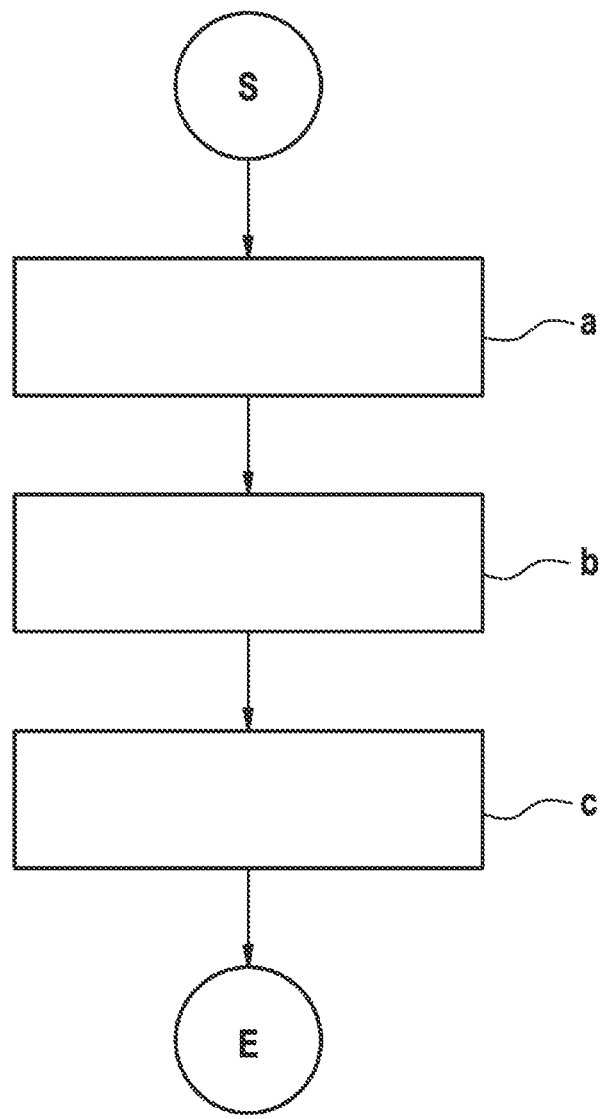
FIG. 8 shows a method for electrically connecting a connection pin of a housing frame according to the disclosure to a circuit carrier of a control unit.

FIG. 8 shows a method for electrically connecting a connection pin of a housing frame according to the disclosure to a circuit carrier of a control unit.

Here, a housing frame 10, 11 according to the disclosure for example in accordance with FIGS. 1 and 2 or in accordance with FIGS. 4 and 5 is provided at the beginning of the method in a method step a. In addition, a circuit carrier 30 which is arranged on a heat sink 40 is provided in method step a. Here, the circuit carrier 30 can be configured as a DBC substrate.

Then, in a method step b, the housing frame 10, 11 is pressed onto the heat sink 40 of the control unit 5, 6 in the perpendicular direction 15 in relation to the main plane of extent 13 of the housing frame 10, 11 in such a way that the connection foot 21 of the connection pin 20 rests on the circuit carrier 30 in a manner plane-parallel in relation to the main plane of extent 33 of the circuit carrier 30. In particular, the housing frame 10, 11 and its connection pin 20 are configured here in such a way that, in addition to the connection foot 21 resting in a plane-parallel manner on the circuit carrier 30, on account of the resilient section 22, a force 16 which presses the connection foot 21 onto the circuit carrier 30 acts on the connection foot 21 in a perpendicular direction 15 in relation to the main plane of extent 33 of the circuit carrier 30. Then, in a method step c, the connection foot 22 is laser-welded to the circuit carrier in order to produce a laser welding connection 24 which allows an electrical connection between the circuit carrier 30 and the connection pin 20.

The invention claimed is:

1. A housing frame for a control unit for driving an electrical machine, comprising: a housing structure defining a control unit receiving space; and at least one connection pin configured to electrically contact a circuit carrier of the control unit when the control unit is positioned in the control unit receiving space, the at least one connection pin including a resilient section, wherein the connection pin has a connection foot, wherein the connection pin is injection-molded into the housing structure in such a way that the connection pin extends from the housing structure so as to be positioned in electrical contact with the circuit carrier at the connection foot when the control unit is positioned in the control unit receiving space, wherein the connection foot is secured to the circuit carrier by way of laser welding, wherein the cross-sectional area of the at least one connection pin in the resilient section is configured to be smaller than outside the resilient section at least in regions, wherein: a cross-sectional area of the connection foot is larger than the cross-sectional area of the resilient section, and wherein: a cross-sectional area of a portion of the connection pin within the housing structure is larger than the cross-sectional area of the resilient section.

2. The housing frame as claimed in claim 1, wherein the resilient section of the at least one connection pin is configured in an L-shape.

3. The housing frame as claimed in claim 1, wherein the connection foot is configured with a predetermined angle in relation to a main plane of extent of a surface of the housing structure.

4. A control unit for driving an electrical machine, comprising: a circuit carrier; a housing frame having (i) a housing structure defining a control unit receiving space, and (ii) at least one connection pin configured to electrically contact the circuit carrier when the control unit is positioned in the control unit receiving space, the at least one connection pin including a resilient section, wherein the connection pin has a connection foot, wherein the connection pin is injection-molded into the housing structure in such a way that the connection pin extends from the housing structure so as to be positioned in electrical contact with the circuit carrier at the connection foot when the control unit is positioned in the control unit receiving space, wherein the connection foot is secured to the circuit carrier by way of laser welding, and wherein the cross-sectional area of the at least one connection pin in the resilient section is configured to be smaller than outside the resilient section at least in regions, wherein: a cross-sectional area of the connection foot is larger than the cross-sectional area of the resilient section, and wherein: a cross-sectional area of a portion of the connection pin within the housing structure is larger than the cross-sectional area of the resilient section.

5. The control unit as claimed in claim 4, wherein the circuit carrier is configured as a DBC substrate.

6. An electrical machine comprising a control unit as claimed in claim 5.

7. A method for electrically connecting a connection pin of a housing frame to a circuit carrier of a control unit, comprising: pressing the housing frame onto a heat sink of the control unit in the perpendicular direction in relation to a main plane of extent of a surface of a housing structure of the housing frame in such a way that a connection foot of the connection pin rests on the circuit carrier in a manner plane-parallel in relation to the main plane of extent of the circuit carrier, flexing a resilient section of the at least one connection pin while pressing the housing frame onto the heat sink, wherein the cross-sectional area of the at least one connection pin in the resilient section is configured to be smaller than outside the resilient section at least in regions, thereby holding the circuit carrier in place; and laser welding the connection foot to the circuit carrier with the circuit carrier held in place, wherein: a cross-sectional area of the connection foot is larger than the cross-sectional area of the resilient section, and wherein: a cross-sectional area of a portion of the connection pin within the housing structure is larger than the cross-sectional area of the resilient section.

8. The method as claimed in claim 7, wherein the circuit carrier is configured as a DBC substrate.

9. The control unit as claimed in claim 4, wherein the resilient section is configured in an L-shape.

10. The control unit as claimed in claim 4, wherein the connection foot is configured with a predetermined angle in relation to a main plane of extent of a surface of the housing structure.

11. The housing frame as claimed in claim 1, wherein the resilient section of the at least one connection pin is configured in an S-shape.

12. The control unit as claimed in claim 4, wherein the resilient section is configured in an S-shape.

13. The method as claimed in claim 7, wherein flexing the resilient section comprises:

flexing an S-shaped resilient section of the at least one connection pin while pressing the housing frame onto the heat sink.

* * * * *